United States Patent [19]
Lo

[11] Patent Number: 6,026,141
[45] Date of Patent: Feb. 15, 2000

[54] ONE LOAD CONDITIONAL LOOK AHEAD COUNTER

[75] Inventor: John M. Lo, Fremont, Calif.

[73] Assignee: Toshiba America Electronic Components Inc., Irvine, Calif.

[21] Appl. No.: 09/118,233

[22] Filed: Jul. 16, 1998

[51] Int. Cl.[7] .................................................. H03K 21/02
[52] U.S. Cl. .............................. 377/111; 377/26; 377/114
[58] Field of Search .............................. 377/111, 26, 114; 365/189.02, 221, 230.02

[56] References Cited

U.S. PATENT DOCUMENTS

| | | | |
|---|---|---|---|
| 3,701,890 | 10/1972 | Dummermuth | 235/150.31 |
| 4,193,539 | 3/1980 | Bowman et al. | 235/92 NG |
| 4,330,751 | 5/1982 | Swain | 328/61 |
| 5,065,042 | 11/1991 | Thomsen et al. | 307/269 |
| 5,122,757 | 6/1992 | Weber et al. | 328/158 |
| 5,293,626 | 3/1994 | Priest et al. | 395/534 |
| 5,347,276 | 9/1994 | Gilardi | 341/59 |
| 5,384,744 | 1/1995 | Lee | 365/221 |
| 5,483,566 | 1/1996 | O'Hara, Jr. et al. | 377/73 |
| 5,528,169 | 6/1996 | New | 326/40 |
| 5,535,377 | 7/1996 | Parks | 395/550 |
| 5,557,575 | 9/1996 | Lee | 365/221 |
| 5,574,896 | 11/1996 | Li et al. | 395/555 |

*Primary Examiner*—Margaret R. Wambach
*Attorney, Agent, or Firm*—Limbach & Limbach L.L.P.

[57] ABSTRACT

A high modulus counter is provided for receiving a counter enable (CE) signal which switches between digital states. The counter is a single load conditional look ahead counter having a carry chain isolated from a timing critical path. The counter includes one toggle flip-flop for receiving the CE signal. The flip-flop has a first output and a second output. The first output and the second output are connected to an even counter and an odd counter, respectively. Both the output of the first counter and the output of the second counter are received by each of a plurality of multiplexers which are controlled by the first output of the toggle flip-flop. In this way, the high modulus counter outputs and increments the pointer signals of the odd counter and the even counter, alternatively. The even and odd internal counters are initially set at zero and one, respectively, and each increments by two. A second flip-flop may additionally receive the external CE signal for synchronization. The outputs of the flip-flop may also be received by a pair of AND gates, the outputs of which are received by a pair of PLS generators. The two PLS generator outputs then serve as the respective CE signals for the odd and even counters.

10 Claims, 3 Drawing Sheets

ONE LOAD CONDITIONAL LOOK AHEAD COUNTER

BACKGROUND OF THE INVENTION

1. Field of the Invention

The invention relates to a digital counter, and particularly to a digital counter having a carry chain isolated from a timing critical path.

2. Discussion of the Related Art

When the field of digital microprocessor electronics was in its infancy, gate speeds and electronic group velocities in conducting interconnectors ($\sim 10^{10}$ cm/s) were so relatively fast compared to processor speeds that the time for a signal to travel from one end of a bus to the other, and switch any gates along the way, was negligible. Today, 333 Megahertz (three nanosecond (ns)) processors are being marketed at retail computer stores. One Gigahertz (one nanosecond) processors are around the corner. Since an electron travelling at $10^{10}$ cm/s only travels 10 cm in one nanosecond, and gate technology has advanced only into the nanosecond regime, limited electron velocities and gate switching speeds are now necessitating more efficient digital electronics components designs, including those for counters as addressed in this application.

FIG. 1 shows a one-bit counter of the prior art. The counter has a modulus of two since it can be in either of two data states. The counter of FIG. 1 includes a D flip-flop 2 connected to a +1 adder 4. Each of the flip-flop 2 and the +1 adder 4 is a network of logic gates. The flip-flop 2 is a clock synchronized D latch that is enabled at periodic clock edges. The +1 adder 4 performs combinatorial logic and is incrementable by one.

FIG. 2 shows the counter of FIG. 1 with a multiplexer 6 connected conventionally between the flip-flop 2 and the +1 adder 4. The output of the multiplexer 6 is received by the input of the flip-flop 2. The multiplexer 6 multiplexes the outputs of both the +1 adder 4 and the flip-flop 2. The output of the multiplexer 6 is shown to be controlled by a counter enable (CE) signal. The flip-flop 2 is synchronized by an internal clock.

The outputs of more than one flip-flop 2 may each be received by an input bus of the +1 adder 4 to form a conventional multiple bit counter 8, as shown in FIG. 3. Generally, an n-bit counter can be said to have a modulus of $2^n$ because it can represent, in binary, a number between zero and ($2^n - 1$). The multiple bit counter 8 of FIG. 3 includes multiple combinations of multiplexers 6 and flip-flops 2. Each multiplexer 6 is shown receiving a CE signal 10. The CE signal 10 is coming in from an external source and synchronizing and controlling the output of each multiplexer 6.

FIG. 4 shows a conventional 6-bit counter comprising six flip-flops 2, one for each bit. Advances in digital electronics have enabled higher modulus counters including today's 64 bit PCI controller. As shown in FIG. 4, a clock signal CLK is received by each flip-flop 2. The clock signal CLK carries a sufficient potential to enable each flip-flop 2 along the width of the bus and switches each latch 2 in one clock period or less.

A 64-bit PCI controller under existing standard allows only a three ns setup time to latch the CE signal 10. An outbound FIFO read pointer, or counter, has to decide whether to advance to the next count based on the state of the IRDY# or TRDY# flip-flop CE signals. If the read pointer has to advance to the next count, it has to change state at the rising edge of the PCI clock. The same clock is also used to latch the IRDY# and TRDY# control signals.

A first problem arises that, when CE signals change data states, they must convey information to all of the multiplexers 6 of the conventional counter before switching again. It is, however, difficult to feed multiple multiplexer inputs and latch the gates along a high modulus counter bus with only a one-to-three nanosecond CE signal period within which to do so.

A second problem arises that the CE signal 10 voltage of conventional counters must be great enough to enable a load to be dropped on each multiplexer 6-flip-flop 2 combination along a bus. The more multiplexers 6 there are, corresponding to an increased modulus of the counter, the more propagation delay is incurred on the CE signal line to switch each latch and generate a pulse for output to, e.g., an adder. The voltage is fixed at 3.3 volts.

In summary, a problem exists with current counter designs. On the one hand, having a faster digital system means less time is available for a counter CE signal 10 to supply its information to each critical point, i.e., latch, along the bus of the counter. On the other hand, having higher modulus counters means that more time is needed for the CE signal 10 to accomplish this task using conventional design techniques.

SUMMARY OF THE INVENTION

It is realized in the present invention that a high modulus counter need not process all of the CE signal information as quickly as the CE signal changes digital states. As long as the flip-flop which ultimately drives the counter is latchable with the CE signal information within its signal period ($\sim 3$ nanoseconds, e.g.), the counter will function usefully in modern devices such as the 64-bit PCI controller. The reason for this is that typical flip-flops can store CE signal information for a time at least as long as a clock period. Thus, a high modulus, e.g., 64-bit, counter is achieved in the present invention wherein each flip-flop is suppliable with CE signal information within a short CE signal period, e.g., 3 ns, notwithstanding whether the total processing time of the counter is longer than the CE signal period.

The present invention solves the aforementioned problem and achieves the desired features by providing a single load conditional look ahead counter having a carry chain isolated from a timing critical path. The counter includes a flip-flop, one or more internal counters and several multiplexers. The flip-flop receives an external counter enable signal. Each internal counter receives an output from the flip-flop. One output of the flip-flop is connected to each multiplexer as a control signal to control the output of the multiplexer. Each multiplexer receives the output of each internal counter. Each multiplexer outputs digital count information to components external to the single load conditional counter.

BRIEF DESCRIPTION OF THE DRAWINGS

FIG. 6b shows a PLS generator of the second embodiment of FIG. 6a.

FIG. 7 illustrates a counting process performable by the counters of FIGS. 5 and 6a.

FIG. 8 shows a digital counter according to a third embodiment of the present invention.

DETAILED DESCRIPTION OF THE PREFERRED EMBODIMENT

Figure 5:
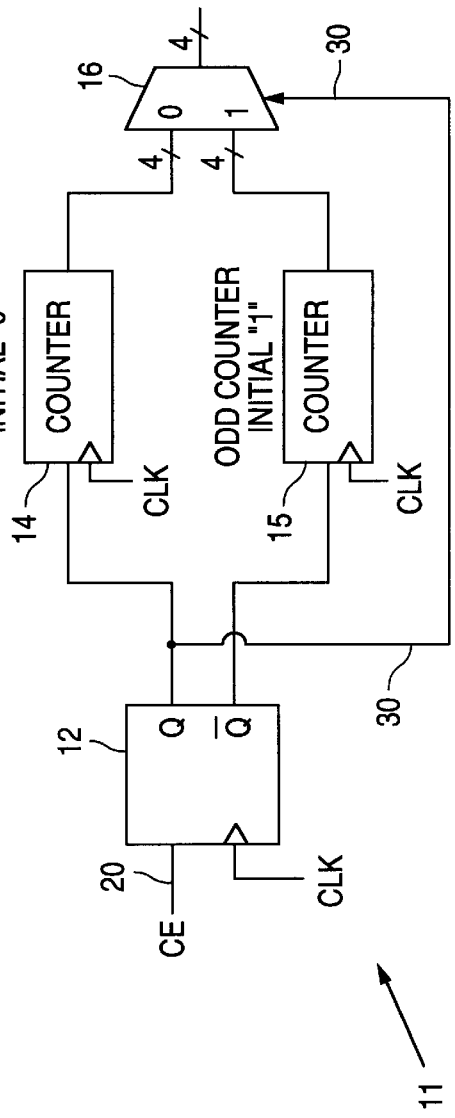
FIG. 5 shows a digital counter according to a first embodiment of the present invention.

FIG. 5 shows a digital look ahead counter 11 according to a preferred embodiment of the present invention. The look ahead counter 11 of FIG. 5 includes a flip-flop 12 having a first output Q and a second output $\overline{Q}$, $\overline{Q}$ being the inverse of Q. The flip-flop 12 has an internal clock for synchronization of its outputs Q and $\overline{Q}$ with other components of the look ahead counter 11 and/or larger system to which the look ahead counter 11 is a component. The first output Q serves as an input for a first counter 14. The second output $\overline{Q}$ serves as an input to a second counter 15. The first output Q also serves as a control signal for a multiplexer 16.

The first output Q toggles at the rising edge of the internal clock signal. At such rising edge, a synchronous pulse is generated at the first output Q and output to both the first counter 14 and the multiplexer 16. The second output $\overline{Q}$ toggles at the falling edge of the internal clock signal. At such falling edge, a synchronous pulse is generated at the second output $\overline{Q}$ and output to the second counter 15.

The flip-flop 12 receives a CE signal 20 from an external source. The CE signal 20 is changing states rapidly and preferably has a period on the order of one to three nanoseconds. The flip-flop 12 is latched during the period of the CE signal 20. The flip-flop 12 holds the signal for a longer time than the period of the CE signal 20 and is preferably on the order of 15 nanoseconds. During the time the flip-flop 12 holds the signal information, the flip-flop 12 generates the synchronous signals described above for output to the first counter 14, the second counters 15 and the multiplexer 16.

The first counter 14 is designated an even counter. The first counter 14 is initially set at "zero" and is incrementable by two, or is a +2 adder. Therefore, integer values which may be stored in digital binary form in the first counter 14 include zero, two, four, six, etc. The first counter 14 generates a synchronized pulse including information as to its present even integral value utilizing an internal clock and outputs the signal to the multiplexer 16.

The second counter 15 is designated an odd counter. The second counter 15 is initially set at "one" and is incrementable by two, or is a +2 adder. Integer values may be stored in digital binary form in the second counter 15 including one, three, five, etc. The second counter 15 generates a synchronized pulse including information as to its present odd integral value utilizing an internal clock and outputs the signal to the multiplexer 16.

The multiplexer 16 receives both the output of the first counter 14 and the output of the second counter 15. The multiplexer 16 also receives the first output Q of the flip-flop 12 as a control signal. The multiplexer 16 is thus switched by the input to the first counter 14. The multiplexer 16 then outputs, in synchronization, integral values incrementing by one each successive digital output value. The multiplexer 16 thus outputs the values zero, one, two, three, . . . in ascending order.

The first counter 14 and the second counter 15 may each be connected to any number of multiplexers 16. FIG. 5 shows that four multiplexers 16 may be fed by the outputs of the first counter 14 and the second counter 15. If, e.g., the first and second counters 14, 15 are even and odd counters counting to fifteen by twos and starting at zero and one, respectively, then the look ahead counter 11 is a four-bit counter, which can count from 0 to 15, wherein the outputs of the first and second counters 14, 15 are each received and later output by four multiplexers 16, as shown in FIG. 5. The look ahead counter 11 can be modified to form a higher modulus counter by simply connecting further multiplexers 16 to the outputs of the first and second counters 14, 15.

A key feature of the look ahead counter 11 of FIG. 5 is that the external CE signal 20 feeds only the flip-flop 12. The CE signal 20 does not feed a growing number of multiplexers 16 as the modulus of the counter 11 is increased. Therefore, a 64-bit counter, e.g., can be realized with the CE signal 20 only feeding a single flip-flop 12. More than one flip-flop including the flip-flop 12 indicated in FIG. 5 may receive the CE signal 20, but what is advantageous is that the number of flip-flops can be made less than the number of bits of the look ahead counter 11 and doesn't increase as the modulus of the look ahead counter 11 is increased.

Figure 1:
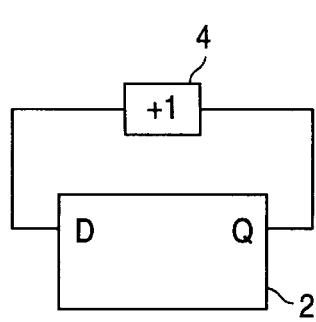
FIG. 1 shows a one-bit counter of the prior art.
Figure 2:
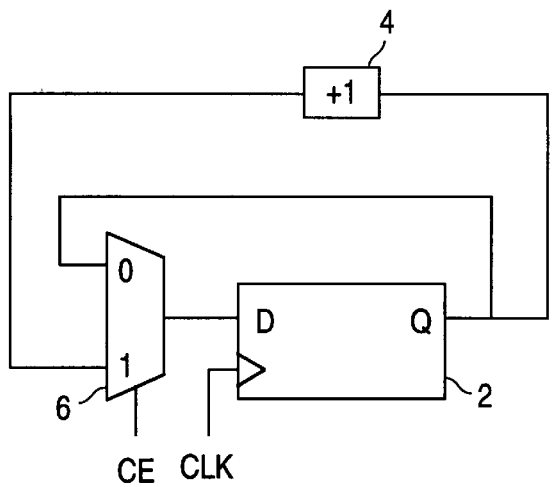
FIG. 2 shows a one-bit counter with multiplexing of the prior art.
Figure 3:
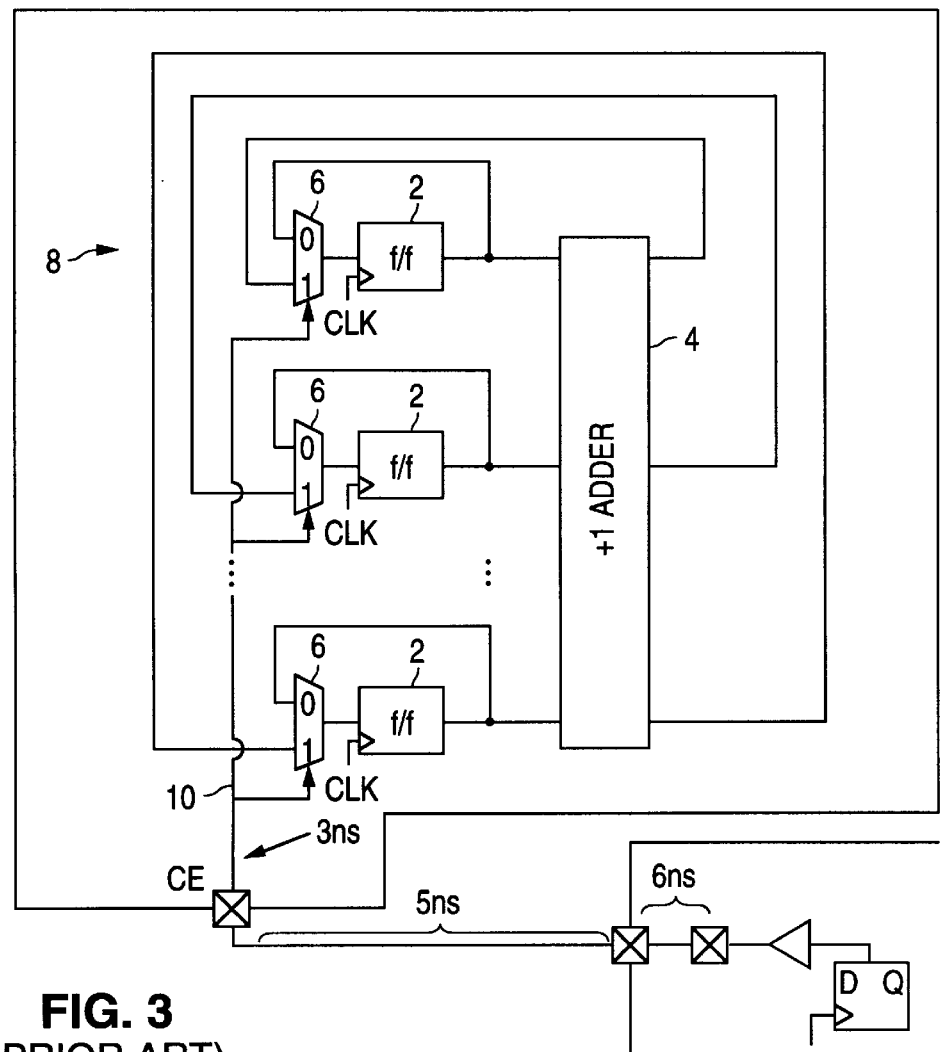
FIG. 3 shows a bus controlled counter with multiplexing of the prior art.
Figure 4:
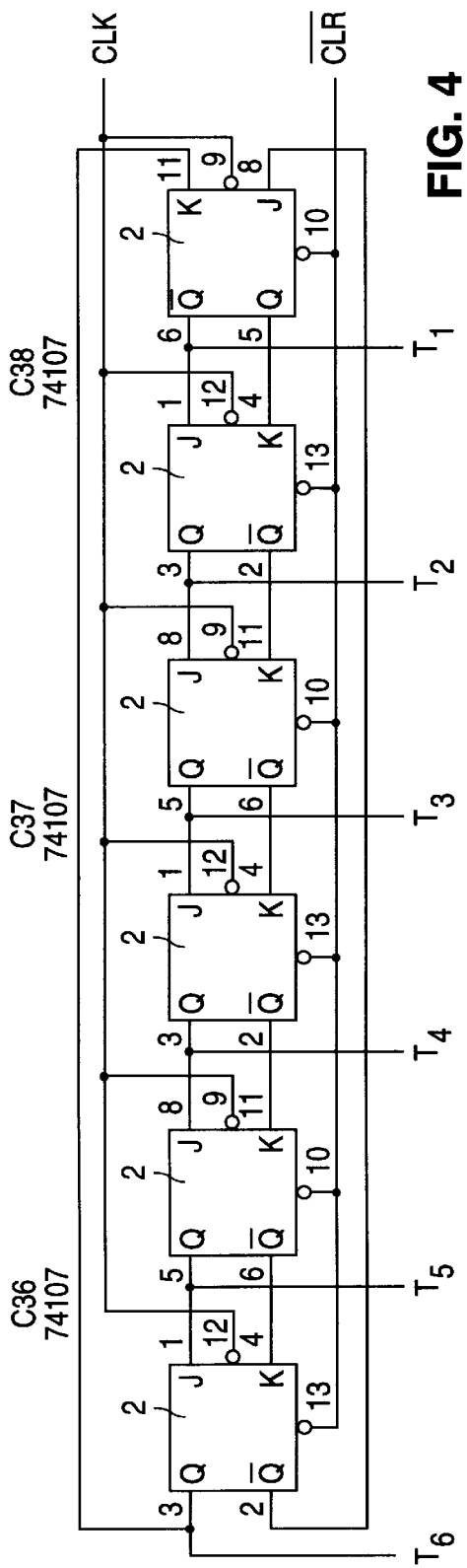
FIG. 4 shows a six-bit counter of the prior art.

As previously summarized, it is realized in the present invention that a high modulus counter need not process all of the CE signal information as quickly as the CE signal changes digital states. As long as the flip-flop(s) which ultimately drive the counter are latchable with the CE signal information within its signal period, the counter will function usefully in modern devices such as the 64-bit PCI controller. The reason for this is that typical flip-flops can store CE signal information for at least as long as a clock period. Referring to FIG. 3, a 66 MHz PCI clock period, e.g., is approximately 15 nanoseconds. FIG. 3 shows a 6 nanosecond time allotment for signal information to propagate through and be sent from a PCI chip which is ultimately connected to a counter. An additional 5 nanoseconds is allotted to trace delay. There is also a 1 nanosecond time allotment for clock jitter. Thus, only 3 nanoseconds remains available for latching the CE signal.

Figure 6A:
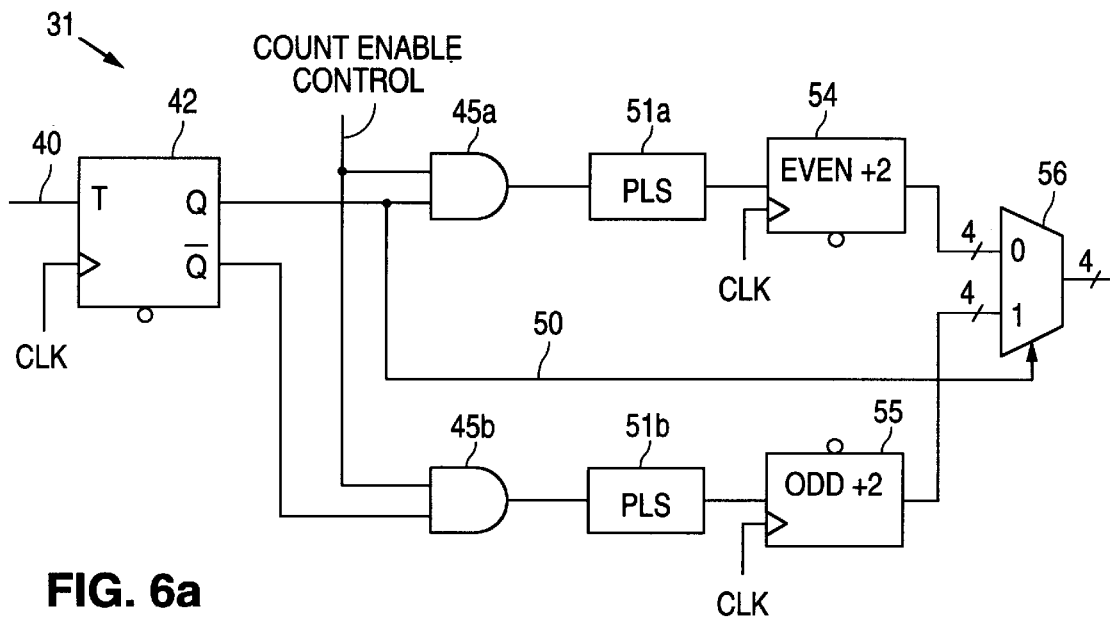
FIG. 6a shows a digital counter according to a second embodiment of the present invention.

FIG. 6a shows a look ahead counter 31 according to a second embodiment of the present invention. A CE signal 40 is received from an external source by a first flip-flop 42. The CE signal 40 is a Trdylrdy signal and comprises two signals: an IRDY# signal and a TRDY# signal. It is recognized in the present invention that these two signals (TRDY# and IRDY#) are used to advance the read pointer(s) of the look ahead counter 31. In the embodiment of FIG. 6a of the present invention, the TRDY# and IRDY# signals go only to a first flip-flop 42, notwithstanding that the look ahead counter 31 has a higher modulus than a one bit counter. This is advantageous over prior art counters because the CE signal 40 is not received by a separate flip-flop for every bit.

The first flip-flop 42 is toggled and has a first output Q and a second output $\overline{Q}$. The first output Q of the first flip-flop 42 is received by both a first AND gate 45a and by a multiplexer 56. The second output $\overline{Q}$ of the first flip-flop 42 is received by a second AND gate 45b. The output of the first AND gate 45a is received by a first PLS generator 51a. The output of the second AND gate 45b is received by a second PLS generator 51b.

Figure 6B:
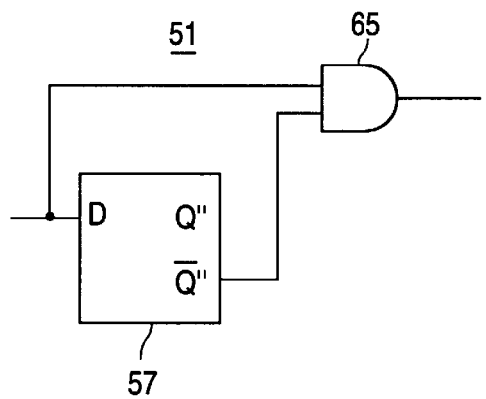

Referring to FIG. 6b, each of the first PLS generator 51a and the second PLS generator 51b includes a flip-flop 57 and an AND gate 65. The flip-flop 57 receives a signal from one of the two AND gates 45a or 45b. The flip-flop 57 has a first output Q" and a second output $\overline{Q}$". The second output $\overline{Q}$" is received by the AND gate 65. The AND gate 65 receives both the second output $\overline{Q}$" of the flip-flop 57 and the signal from one of the two AND gates 45a and 45b that is input to the flip-flop 57. The output of the AND gate 65 of the first and the second PLS generators 51a and 51b is the output of the first and second PLS generators 51a or 55b, respectively.

Referring back to FIG. 6a, the output of the PLS generator 51a is received by a first counter 54 which is an even counter, and thus is a +2 adder having an initial value of "0". The output of the second PLS counter 51b is received by a second counter 55 which is an odd counter, and thus is also a +2 adder having an initial value of "1". The first counter 54 and the second counter 55 are each similar to the respective first counter 14 and second counter 15 of FIG. 5. The outputs of both the first counter 54 and the second counter 55 are received by the multiplexer 56, which is controlled by the first output Q of the first flip-flop 42. More than one multiplexer 56 may receive the outputs of the first counter 54 and the second counter 55, just as with the counter of FIG. 5.

Figure 7:
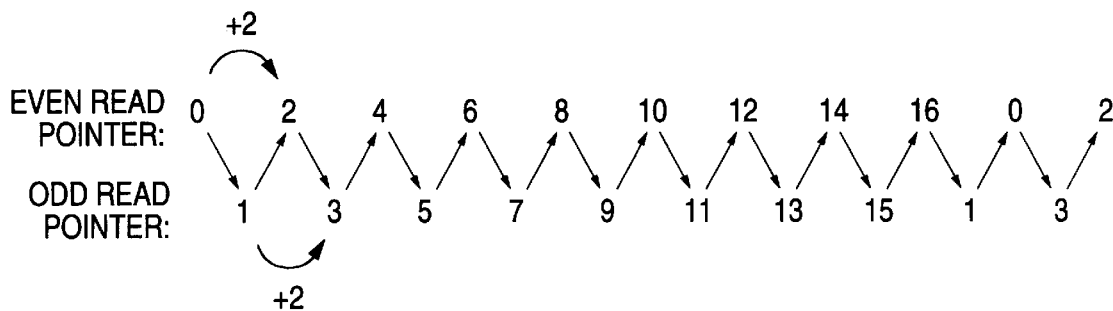

Inspection of each of the first embodiment of FIG. 5 and the second embodiment of FIG. 6a, reveals the differences between them. An AND gate 45(a,b) and a PLS generator 51 (a,b) are successively connected between the respective outputs Q and $\overline{Q}$ and first and second counters 54 and 55 in the second embodiment of FIG. 6a, whereas the AND gates 45a and 45b and the PLS generators 51a and 51b do not appear in the first embodiment of FIG. 5. FIG. 7 illustrates the output of the counter of the preferred embodiments of both FIGS. 5 and 6a. As an example, the first output Q of the first flop 42 is toggled at the rising edge of the PCI clock of the 64-bit PCI controller. At the rising edge, a synchronous pulse is generated to enable the even counter 54 to advance by two. The multiplexer 56 is outputting the value "one" as it selects the value of the odd counter 55 to output. On the following clock, when the CE signal is still asserted, a synchronous pulse is generated to enable the odd counter 55 to advance by two, as a look-ahead calculation. The multiplexer 56 is then outputting the value "two" as it selects the value of the even counter 54 to output.

The odd counter 55 and the even counter 54 are then increased by two alternately. The multiplexer 56 is also outputting the value of the even counter 54 and the odd counter 55, alternatively. In this way, the output of the multiplexer 56 goes from zero to one to two and so on incrementally. If the even and odd counters 54 and 55 are four-bit counters then the counting will go from zero to fifteen and back to zero, for each multiplexer of the counter. There are four multiplexers 56 receiving the output signals of both the even counter 54 and the odd counter 55, and since the first and second counters 14, 15 are even and odd counters counting to fifteen by twos and starting at zero and one, respectively, the counter is a 4-bit counter.

It is to be understood that scope of the invention is set forth in the following claims. The specification and drawings of this application merely serve to illustrate, by way of example, the preferred embodiments of the present invention.

What is claimed is:

1. A digital counter, comprising:

a first flip-flop for receiving an external control signal and outputting a first output signal and a second output signal;

a first counter for receiving the first output signal and for outputting a first pointer signal;

a second counter for receiving the second output signal and for outputting a second pointer signal; and one or more multiplexers for receiving the first output signal as a multiplexer control signal and for receiving and outputting the first and second pointer signals, alternately.

2. The counter of claim 1, wherein the first counter is initially set to zero and the second counter is initially set to one, the first counter incrementing by two at each cycle of the first output signal, the second counter incrementing by two at each cycle of the second output signal.

3. The counter of claim 1, wherein the first counter comprises:

a first AND gate for even counter selection; and a second AND gate for odd counter selection.

4. The counter of claim 3, wherein the second counter comprises:

a third AND gate;

a second flip-flop; and a fourth AND gate for receiving the output of the third AND gate and the output of the second flip-flop, and for outputting the second counter.

5. The counter of claim 1, wherein the first flip-flop is an edge-triggered toggle flip-flop.

6. The counter of claim 5, wherein the first flip-flop receives an external count enable signal for toggling.

7. A digital counter including a flip-flop, one or more counters and a plurality of multiplexers, the flip-flop for outputting at least one output signal, the one or more counters each for receiving one of said at least one output signal of the flip-flop, the plurality of multiplexers for receiving the output of each of the one or more counters, the improvement comprising:

the flip-flop for receiving an external control signal;

each multiplexer of said plurality of multiplexers for receiving one output signal of the flip flop as a control signal; and the output of each multiplexer of said plurality of multiplexers for providing an output signal of the digital counter.

8. A digital counter, comprising:

a flip-flop for receiving an external control signal and outputting an output signal;

a counter for receiving the output signal of the flip flop and for outputting at least one pointer signal;

one or more multiplexers for receiving the output signal of the flip flop as a multiplexer control signal and for receiving and outputting the at least one pointer signal.

9. A method of digital counting, comprising the steps of:

receiving a control signal;

storing the control signal in a flip-flop, said flip-flop having at least one output signal;

incrementing a counter by one by said at least one output signal;

supplying the output of said counter to a multiplexer as an input thereto; and outputting said multiplexer in response to said at least one output signal.

10. A method of digital counting, comprising the steps of:

receiving a control signal;

storing the control signal in a flip-flop, said flip-flop having a first output signal and a second output signal;

incrementing a first counter by two by said first output signal;

incrementing a second counter by two by said second output signal;

supplying the output of said first and second counters to a multiplexer as inputs thereto; and alternately, outputting said multiplexer.

* * * * *